United States Patent
Chadda

(10) Patent No.: US 7,025,860 B2
(45) Date of Patent: *Apr. 11, 2006

(54) METHOD AND APPARATUS FOR THE ELECTROCHEMICAL DEPOSITION AND REMOVAL OF A MATERIAL ON A WORKPIECE SURFACE

(75) Inventor: Saket Chadda, Phoenix, AZ (US)

(73) Assignee: Novellus Systems, Inc., San Jose, CA (US)

(*) Notice: Subject to any disclaimer, the term of this patent is extended or adjusted under 35 U.S.C. 154(b) by 328 days.

This patent is subject to a terminal disclaimer.

(21) Appl. No.: 10/421,489

(22) Filed: Apr. 22, 2003

(65) Prior Publication Data

US 2004/0211662 A1   Oct. 28, 2004

(51) Int. Cl.
*C25D 17/00* (2006.01)
*B23H 7/00* (2006.01)

(52) U.S. Cl. .............. 204/224 M; 204/212; 204/242; 204/275.1; 204/297.01; 205/662; 205/663; 205/668; 205/640; 205/222; 205/87

(58) Field of Classification Search ............... 204/212, 204/242, 224 M, 224 R, 275.1, 297.01; 205/640, 205/662–663, 668, 87, 222
See application file for complete search history.

(56) References Cited

U.S. PATENT DOCUMENTS

| | | | |
|---|---|---|---|
| 5,489,233 A | 2/1996 | Cook et al. | |
| 5,911,619 A | 6/1999 | Uzoh et al. | |
| 6,176,992 B1 | 1/2001 | Talich | |
| 6,251,235 B1 | 6/2001 | Talieh et al. | |
| 6,328,872 B1 | 12/2001 | Talieh et al. | |
| 6,802,955 B1 * | 10/2004 | Emesh et al. | 205/662 |
| 2003/0127320 A1 * | 7/2003 | Emesh et al. | 204/207 |

* cited by examiner

*Primary Examiner*—Roy King
*Assistant Examiner*—Lois Zheng
(74) *Attorney, Agent, or Firm*—Ingrassia Fisher & Lorenz PC

(57) ABSTRACT

An apparatus for performing an electrochemical process on a metallic surface of a workpiece, comprised of a substantially incompressible workpiece support plate. A platen for supporting the workpiece support plate, has at least one opening coupled to a source of electrolyte for receiving an electrolyte solution therethrough and placing the electrolyte solution in contact with the support plate and workpiece. A first conductive element is coupled to, a first potential and positioned proximate the metallic surface, and the carrier is configured to position the workpiece proximate the support plate.

22 Claims, 6 Drawing Sheets

मेथड AND APPARATUS FOR THE
ELECTROCHEMICAL DEPOSITION AND
REMOVAL OF A MATERIAL ON A
WORKPIECE SURFACE

TECHNICAL FIELD

This invention relates generally to techniques for depositing conductive material on and/or for removing conductive material from a workpiece such as a semiconductor wafer. More particularly, this invention relates to an apparatus, a system, and a method for electrolytically depositing and/or removing a conductive material such as copper on/from a workpiece surface. Still more particularly, this invention relates to the electrolytic deposition/removal of conductive material onto/from a workpiece surface utilizing a substantially solid, non-porous, insulating wafer support plate which includes a smooth, low-friction wafer support surface having electrolyte distribution grooves thereon.

BACKGROUND OF THE INVENTION

Chemical mechanical polishing (CMP) is a technique which has been conventionally used for the planarization of semiconductor wafers. For example, see U.S. Pat. No. 5,099,614, issued in March in 1992 to Riarai et al; U.S. Pat. No. 5,329,732 issued July 1994 to Karlsrud et al, and U.S. Pat. No. 5,498,199 issued March 1966 to Karlsrud et al. Furthermore, chemical mechanical polishing is often used in the formation of microelectriconic devices to provide a substantially smooth, planar surface suitable for subsequent fabrication processes such as photoresist coating and pattern definition. A typical chemical mechanical polishing apparatus suitable for planarizing a semiconductor surface generally includes a wafer carrier configured to support, guide, and apply pressure to a wafer during the polishing process, a polishing compound such as a slurry to assist in the removal of material from the surface of the wafer, and a polishing surface such as a polishing pad. In addition, the polishing apparatus may include an integrated wafer cleaning system and/or an automated load/unload station to facilitate automatic processing of the wafers.

A wafer surface is generally polished by moving the surface of the wafer to be polished relative to the polishing surface in the presence of a polishing compound. In particular, the wafer is placed in a carrier such that the surface to be polished is placed in contact with the polishing surface, and the polishing surface and the wafer are moved relative to each other while slurry is supplied to the polishing surface.

Chemical mechanical polishing may also be used to form microelectronic features. For example, a conductive feature such as a metal line, conductive plug, or the like may be formed on a surface of a wafer by forming trenches and vias on the wafer surface, depositing conductive material over the wafer surface and into the trenches and vias, and removing the conductive material on the surface of the wafer using chemical mechanical polishing, leaving the vias and trenches filled with conductive material. The conductive features often include a barrier material to reduce unwanted diffusion of the conductive material and to promote adhesion between the conductive material and any adjacent layer of the circuit.

Aluminum is often used to form conductive features because its characteristics are compatible with conventional deposition (e.g. chemical vapor deposition) and etch (e.g., reactive ion etch) techniques. While the use of aluminum to form conductive features is adequate in some cases, the use of aluminum in the formation of conductive features becomes increasingly problematic as the size of the conductive feature decreases. In particular, as the size of the conductive feature decreases, the current density through the feature generally increases, and thus the feature becomes increasingly susceptible to electromigrations; i.e., the mass transport of metal due to the flow of current. Electromigration may cause short circuits where the metal accumulates, open circuits where the metal has been depleted, and/or other circuit failures. Similarly, increased conductive feature resistance may cause unwanted device problems such as access power consumption and heat generation.

Recently, techniques have been developed which utilize copper to form conductive features because copper is less susceptible to electromigration and exhibits a lower resistivity than aluminum. Since copper does not readily form volatile or soluble compounds, the copper conductive features are often formed using damascene. More particularly, the copper conductive features are formed by creating a via within an insulating material, depositing a barrier layer onto the surface of the insulating material and into the via, depositing a seed layer of copper into the barrier layer, electrodepositing a copper layer onto the seed layer to fill the via, and removing any excess barrier metal and copper from the surface of the insulating material using chemical and mechanical polishing. During the electrodeposition process, additives such as leveling agents may be added to the plating bath to reduce the formation of voids within the conductive features.

Forming copper conductive features according to the method described above can be relatively expensive, in part because each material deposition and removal step is typically carried out using dedicated equipment. U.S. Pat. No. 6,176,922, issued to Talieh on Jan. 23, 2001, discloses an apparatus for both electroplating and polishing copper. The apparatus disclosed includes a wafer carrier having a cathode electrode contact that contacts the surface of the wafer to be polished. Unfortunately, the apparatus shown in Taleih is problematic is several ways. In particular, a film deposited using the apparatus of Taleih may be undesirably non-uniform because the cathode electrode contacts the wafer in a limited number of fixed locations about the perimeter of the wafer. Such a cathode contact configuration may lead to increased deposition about the perimeter of the wafer, i.e., in the areas proximate to the cathode contact, and thus lead to non-uniform deposition of the conduct film. Furthermore, wafer areas in contact with the cathode generally cannot include active devices.

As stated previously, the CMP machine typically includes a wafer carrier configured to hold, rotate, and transport a wafer during the process of polishing or planarizing the wafer. During the planarizing operation, a pressure applying element (e.g., a rigid plate, a bladder assembly, or the like) that may be an integral part of the wafer carrier, applies pressure such that the wafer engages a polishing surface with a desired amount of force. The carrier and the polishing surface are rotated, typically at different rotational velocities, to cause relative lateral motion between the polishing surface and the wafer and to promote uniformed planarization. The polishing surface generally comprises a horizontal polishing pad that may be formed of various materials described further hereinbelow. The hardness and density of the polishing pad depend on the material that is being polished, and an abrasive slurry may also be applied to the polishing surface which acts to chemically weaken the molecular bonds at the wafer surface so that the mechanical action of the polishing pad and slurry abrasive can remove the undesirable material from the wafer surface.

Unfortunately, the CMP process tends to leave stresses in the worked workpiece leading to subsequent cracking and shorting between metal layers. Furthermore, the CMP process may result in sheering or crushing of fragile layers. This process also has a tendency to cause dishing in the center of wide metal features, such as trenches and vias, oxide erosion between metal features, and dielectric oxide loss.

Electrochemical removal is an attractive alternative to CMP because no physical mechanical polishing takes place and therefore significant mechanical stresses are not imparted to the workpiece. Consequently the integrity of the devices is not compromised. Furthermore, electrochemical removal is less likely to cause dishing, oxide erosion, and oxide loss of the dielectric layer. Electrochemical removal is based on electroetching and electrochemical machining; that is, the removal of a thin layer of metal from a substrate through the action of an electrical solution and electricity. For example, if two electrodes, an anode and a cathode, are emerged in a liquid electrolyte and are wired so as to permit a potential difference between the electrodes, metal atoms in the anode are ionized by the electricity and go into the solution as ions. Depending on the chemistry of the metals and salt, the metal ions from the anode either plate the cathodes, fall out as precipitate, or remain in solution.

The above referred to polishing plate or pad may be a blown urethane polishing pad of the type commercially available from Rodel Inc. of Phoenix, Ariz. and identified as an IC1000. This expanded foam polishing pad contains a large number of voids in the form of small, generally spherical micro-bubbles. Since such polishing pads are first grown in a cake and then sliced to form individual polishing pads, portions of voids or micro-bubbles which have been sliced through appear at the polishing surface creating a surface microtexture. Other known polishing pads may be manufactured from fiber meshes of felts; however, they are still porous containing voids thus likewise exhibiting a surface microtexture.

In the case of a mechanical polishing process, the surface microtexture is advantageous because slurry is captured by the microtexture causing the slurry to engage the surface which assists in the distribution of slurry thereacross. However, in the case of electrodeposition or electroremoval, no actual mechanical polishing takes place. The polishing pad (now more appropriately referred to as a wafer support plate) contacts the wafer surface to distribute electrolyte thereacross but does not perform any actual mechanical polishing. The wafer support plate also acts as an insulator between the anode and cathode of the electrodeposition/electroremoval apparatus.

The use of known polishing pads (e.g. a Rodel IC1000) in an electrodeposition or electroremoval process creates certain problems. For example, machining of the polyurethane pad to produce the required anode holes, cathode holes, and electrolyte distribution channels or grooves creates localized heating which in turn produces localized hardness (e.g. at the edges of the holes). These regions of localized hardness can cause scratching of the wafer surface. In addition, the above referred to microtexture on the wafer support surface caused by the presence of pores, voids, and bubbles in the material from which the wafer support plate is manufactured is not conducive to an even distribution of electrolyte in an electrodeposition or electroremoval process. Further, the porosity of traditionally used materials may cause electron leakage from cathode to anode.

In view of the foregoing, it should be appreciated that it would be desirable to provide improved methods and apparatus for the electrochemical deposition and/or removal of a metal on a workpiece such as a semiconductor wafer. It should also be appreciated that it would be desirable to provide a void-free wafer support plate which presents a substantially smooth, low coefficient of friction, wafer contact surface while at the same time providing even distribution of electrolyte on a wafer surface during an electrodeposition or electroremoval process.

BRIEF DESCRIPTION OF THE DRAWINGS

The following drawings are illustrative of particular embodiments of the invention and therefore do not limit the scope of the invention, but are presented to assist in providing a proper understanding of the invention. The drawings are not to scale (unless so stated) and are intended for use in conjunction with the explanations in the following detailed description. The present invention will hereinafter be described in conjunction with the appended drawing figures, wherein like numerals and like elements, and.

DETAILED DESCRIPTION OF EXEMPLARY EMBODIMENTS

The following description is exemplary in nature and is not intended to limit the scope, applicability, or configuration of the invention in any way. Rather, the following description provides a convenient illustration for implementing exemplary embodiments of the invention. Various changes to the described embodiments may be made in the function and arrangement of the elements described herein without departing from the scope of the invention.

Figure 1:
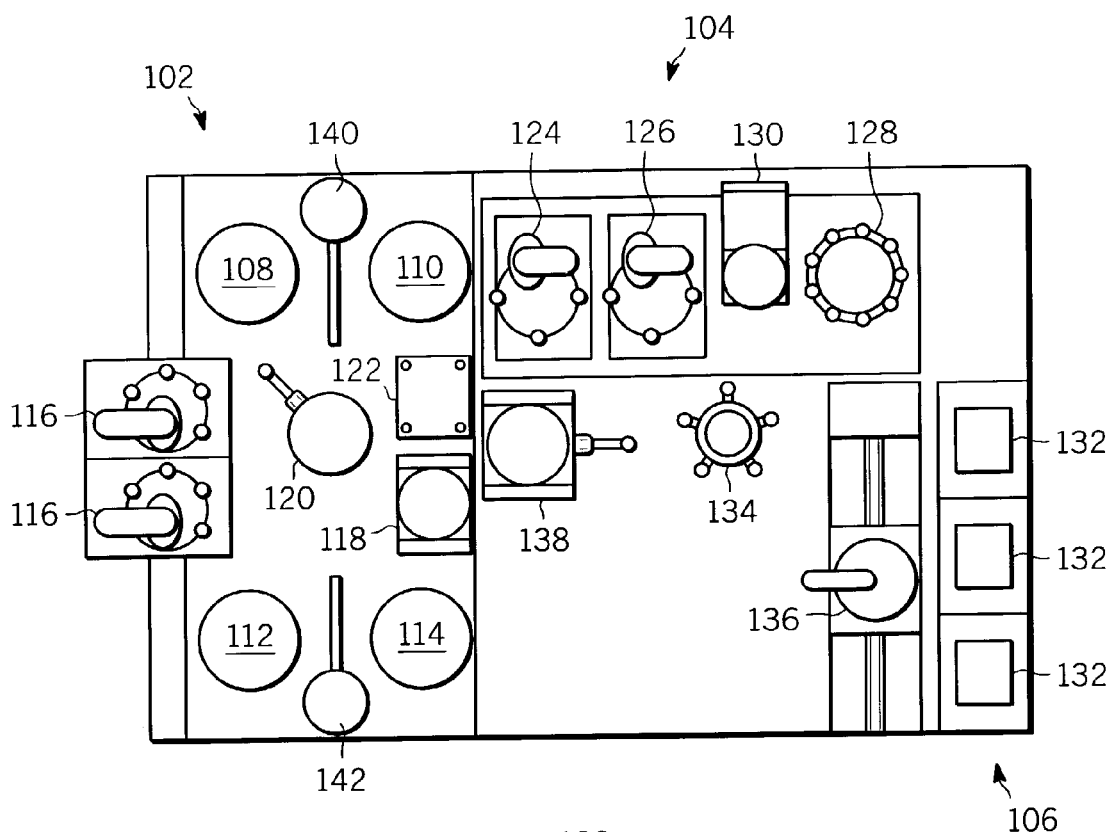
FIG. 1 is a top cutaway view of an electrochemical deposition and/or removal system in accordance with the present invention.

FIG. 1 illustrates a top cutaway view of an apparatus 100, suitable for electrochemically depositing or removing conductive material onto or from the surface of a workpiece in accordance with the present invention. Apparatus 100 includes a multi-station system 102, a clean system 104, and a wafer load/unload station 106. In addition, apparatus 100 includes a cover (not shown) that surrounds apparatus 100 to isolate apparatus 100 from the surrounding environment. In accordance with a preferred embodiment in the present invention, machine 100 is a Momentum machine available from SpeedFan-IPEC Corporation of Chandler, Ariz. However, machine 100 may be any machine capable of removing or depositing material from or onto a workpiece surface.

Although the present invention may be used to remove material or deposit material on the surface of a variety of workpieces such as magnetic disks, optical disks, and the like, the invention is conveniently described below in connection with removing and depositing material on the surface of a wafer. In the context of the present invention, the term "wafer" shall mean semiconductor substrates, which may include layers of insulating, semiconductor, and conducting layers or features formed thereon and used to manufacture microelectronic devices.

Exemplary station 102 includes four deposition/removal stations 108, 110, 112, and 114, that each operate independently; a buff station 116; a stage 118; a robot 120; and optionally, a metrology station 122. Stations 108–114 may be configured as desired to perform specific functions. In accordance with the present invention, at least one of the stations 108–114 includes an electrochemical deposition apparatus as described herein. Another one of the stations 108–114 includes electrochemical removal apparatus as described herein, and the remaining stations may be configured for traditional chemical mechanical polishing or the like.

System 102 also includes surface conditioners 140 and 142. The configuration of conditioners 140 and 142 generally depend on the type of polishing surface to be conditioned. For example, if the polishing surface comprises a polyurethane polishing pad, conditioners 140 and 142 may include a rigid substrate coated with diamond material. Various other surface conditioners may also be used in accordance with the present invention.

Clean system 104 is generally configured to remove debris such as slurry residue and material from the wafer surface. In accordance with the illustrated embodiment, system 104 includes clean stations 124 and 126, a spin rinse dryer 128, and a robot 130 configured to transport the wafer between clean stations 124 and 126 and spin rinse dryer 128. Alternatively, clean station 104 may be separate from the remainder of the electrochemical deposition and removal apparatus. In this case, load station 106 is configured to receive dry wafers for processing, but the wafers may remain in a wet (e.g., deionized water) environment until the wafers are transferred to the clean station. In operation, cassettes 132, including one or more wafers, are loaded onto apparatus 100 at station 106. The wafers are then individually transported to a stage 134 using a dry robot 136. A wet robot 138 retrieves a wafer at stage 132 and transports the wafer to metrology station 122 for film characterization or to stage 118 within system 102. Robot 120 picks up the wafer from metrology station 122 or stage 118 and transports the wafer to one of stations 108–114 for electrochemical deposition or removal of a conductive material. After a desired amount of material has been deposited or removed, the wafer may be transported to another station. Alternatively, as will be more fully discussed below, the environment within one of the stations may be changed from an environment suitable for electrochemical deposition to an environment suitable for electrochemical removal; e.g., by changing the solution and the bias applied to the wafer. In this case, a single station may be used to both deposit material and remove material from the wafer.

After conductive material has been either deposited or removed from the wafer surface, the wafer is transferred to buff station 116 for further processing of the surface of the wafer. The wafer is then transferred to stage 118 which is configured to maintain one or more wafers in a wet (e.g. deionized water) environment.

After the wafer is placed in stage 118, robot 138 picks up the wafer and transports it to clean system 104. In particular, robot 138 transports the wafer to robot 130, which in turn places the wafer in one of the clean stations 124 or 126. The wafer is cleaned using one or more stations 124 and 126 and then is transported to spin rinse dryer 128 to rinse and dry the wafer prior to transporting it to load/unload station 106 using robot 136.

Figure 2:
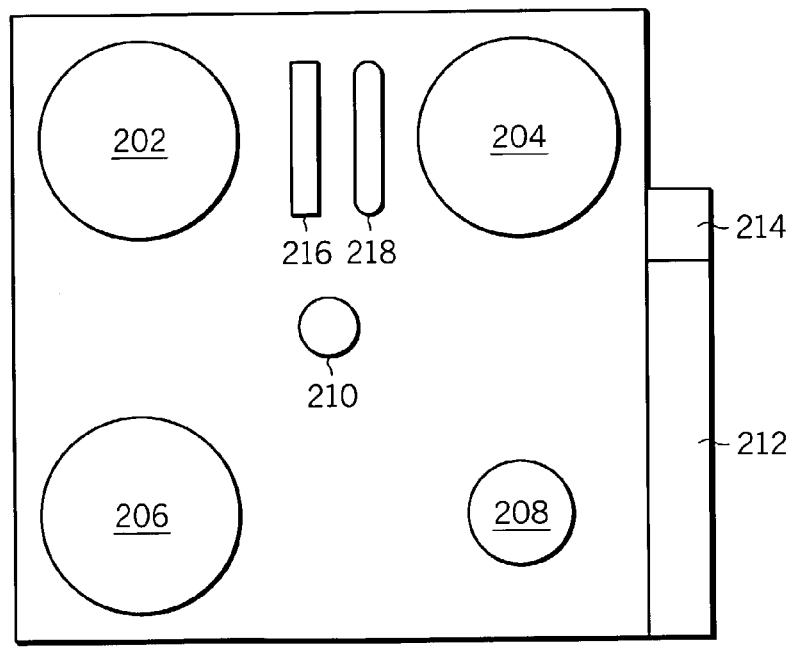
FIG. 2 is a top cutaway view of a portion of an electrochemical deposition and/or removal apparatus in accordance with another embodiment of the present invention.
Figure 3:
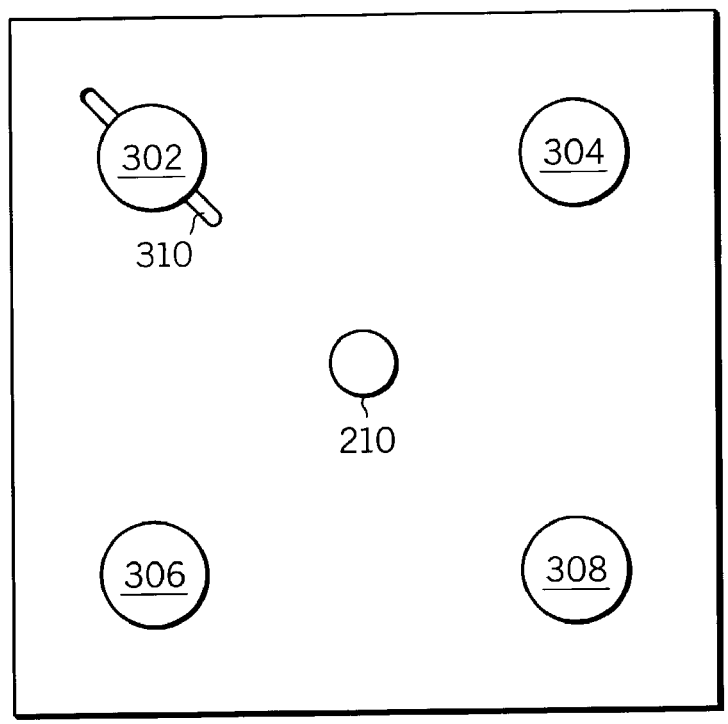
FIG. 3 is a bottom cutaway view of a carousel for use with the apparatus shown in FIG. 2.

FIG. 2 illustrates a top cut away view of another exemplary apparatus 200 configured to electrochemically remove material from or electrochemically deposit material onto a wafer. Apparatus 200 is suitably coupled to carousel 300 illustrated in FIG. 3 to form an automated electrochemical deposition and/or removal system. The system in accordance with this embodiment may also include a removable cover (not shown) overlying apparatus 200 and 300.

Apparatus 200 includes three stations, 202, 204, and 206, a wafer transfer station 208, a center rotational post 210 that is coupled to carousel 300 and which operatively engages carousel 300 to cause carousel 300 to rotate, a load and unload station 212, and a robot 214 configured to transport wafers between stations 212 and 208. Furthermore, apparatus 200 may include one or more rinse washing stations 216 to rinse and/or wash a surface of a wafer before or after electrodeposition or electroremoval. Although illustrated with three stations, apparatus 200 may include any desired number of stations, and one or more such stations may be used to buff a surface of a wafer. Furthermore, apparatus 200 may include an integrated wafer clean and dry system similar to system 104 described above. Wafer station 208 is generally configured to stage wafers before or between operations and may be further configured to wash and/or maintain the wafers in a wet environment.

Carousel apparatus 300 includes heads or carriers, 302, 304, 306, and 308, each configured to hold a single wafer which is to be processed. Each carrier 302–308 is suitably spaced from post 210 such that each carrier aligns with a processing station or station 208. In accordance with one embodiment of the invention, each carrier 302–308 is attached to a rotatable drive mechanism using a Gimble system (not illustrated) which allows carriers 302–308 to cause a wafer to rotate (e.g., during an electrodeposition or electroremoval process). In addition, the carriers may be attached to a carrier motor assembly that is configured to cause the carriers to translate as, for example, along tracks 310. Furthermore, each carrier 302–308 may rotate and translate independently of the other carriers.

In operation, wafers are processed using apparatus 200 and 300 by loading a wafer onto station 208 from station 212 using robot 214. When a desired number of wafers are loaded onto the carriers, at least one of the wafers is placed in a position for processing. The wafer may be positioned by lowering a carrier or a portion thereof (e.g., a wafer holding surface). One or more conditioners 218 may then be employed to condition the polishing surfaces.

Figure 4:
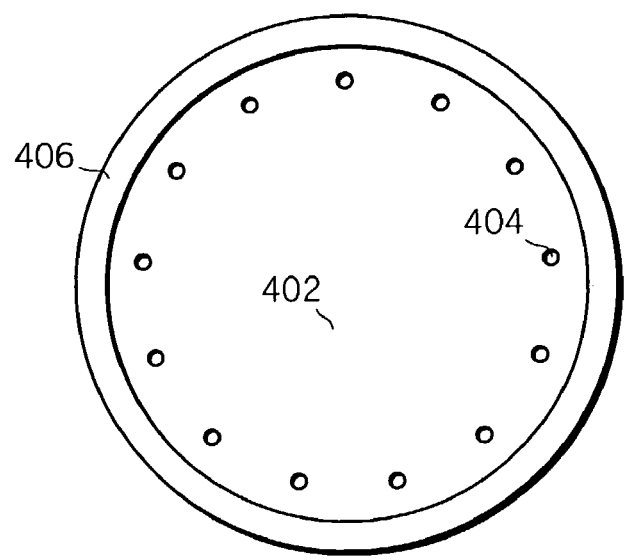
FIG. 4 is a top plan view of a typical workpiece carrier for use in conjunction with the inventive electrochemical deposition apparatus.

During the process, a wafer may be held in place by a carrier 400, illustrated in FIG. 4. Carrier 400 comprises a retaining ring 406 and a receiving plate 402 including one or more apertures 404. Apertures 404 are designed to assist retention of a wafer by carrier 400 by, for example, allowing a vacuum pressure to be applied to the backside of the wafer or by creating enough surface tension to retain the wafer. Retaining ring 406 limits the movement of the wafer during the polishing process.

Figure 5:
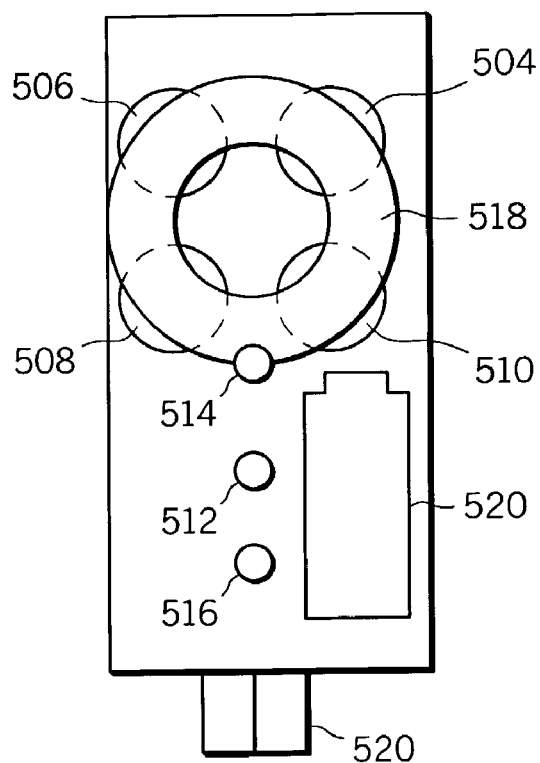
FIG. 5 is a top cutaway view of a portion of an electrochemical deposition and/or removal apparatus in accordance with still another embodiment of the present invention.

FIG. 5 illustrates another system 500 in accordance with the present invention. It is suitably configured to receive a wafer from a cassette 502 and return the wafer to the same or to a predetermined different location within the cassette in a clean common dry state. System 500 includes processing stations 504 and 506, a buff station 508, a head loading station 510, a transfer station 512, a wet robot 514, a dry robot 516, a rotatable index table 518, and a clean station 520. Dry robot 516 unloads a wafer from cassette 502 and places the wafer on transfer station 512. The wafer then travels to stations 504–508 for processing and returns to station 510 for unloading by robot 514 and station 512. The wafer is then transferred to clean system 520 to clean, rinse, and dry the wafer before the wafer is returned to load and unload station 502 using dry robot 516.

Figure 6:
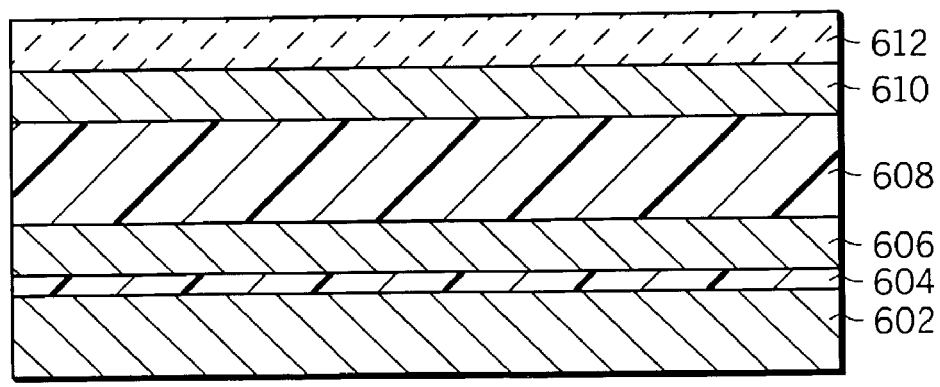
FIG. 6 is a cross-sectional view of a portion of a platen/polishing pad stack for use in conjunction with the present invention.

FIG. 6 is a cross-sectional view of a portion of a platen stack 600 which may be utilized to perform electrochemical deposition and removal (e.g., a portion of one of stations 108–114 in FIG. 1 or stations 202–206 in FIG. 2). Stack 600 includes a platen support member 602 constructed of a suitable material (e.g. titanium, stainless steel), a first conductive element, for example a first electrically conductive layer 606 (e.g. copper), an insulating layer 604 (e.g. plastic) electrically isolating layer 606 from support member 602 for reasons which will become apparent, a second insulating layer 608 (e.g. a ceramic or a non-electrically conductive polymer such as plastic), and a second electrically conductive layer 610 (e.g. copper having a thickness of between 0.1 cm and 3 cm; preferably 1 cm) having a wafer support plate or structure 612 disposed thereon.

In accordance with one embodiment of the invention, wafer support plate 612 is formed from a material exhibiting a low coefficient of surface friction, and a relatively smooth surface finish. It has been found that a smooth, low friction surface can enhance the deposition process by minimizing mechanical abrasion of the metal film being formed on the wafer in situations where the surface of support plate 612 is in actual contact with the surface of the wafer. Preferably, support plate 612 is formed from a material with a coefficient of surface friction of less than about 0.2, and more preferably between approximately 0.06 and 0.1. The surface roughness is preferably less than about 100 micro-inches per inch, and more preferably between about 10 and 50 micro-inches per inch. One skilled in the art will recognize that the actual surface finish can be tailored within these ranges by lapping or polishing the surface of support plate 612 as required.

It is also desirable that support plate 612 be formed of a material that is relatively volume incompressible under an applied pressure load. Volume compressibility can be defined in terms of the bulk modulus, or hydrostatic modulus of the material, and represents the change in volume which occurs in a material under hydrostatic loading, i.e. with pressure applied from all sides. The higher the compressibility of a material, the greater the volume change under an applied pressure load. Preferably the bulk modulus, or compressibility, of support plate 612 is greater than about 50,000 pounds per square inch (psi) under an applied surface pressure of less than 4 psi, and greater than about 70,000 psi under an applied surface pressure of less than 2 psi. Suitable materials with the above properties include non-porous polymers such as for example molded polytetrafluoroethyl-ene (PTFE), available from DuPont under the trade name Teflon®. This material is also highly inert (i.e. chemically resistant), and its hardness is comparable to polyurethane polishing pads of the type referred to above typical for chemical mechanical polishing of wafers. The surface roughness of a Teflon® wafer support plate ranges from approximately 20–50 micro-inches, which is relatively smooth compared, for example, to an IC-1000 CMP polishing pad manufactured by Rodel which ranges from approximately 150–200 micro-inches surface roughness. Other suitable materials from which surface 204 may be manufactured are polyether ether keytone, acetal homopolymer, polyethylene terapthalate, polyphenyl sulfide, and polyvinyl chloride.

Figure 7:
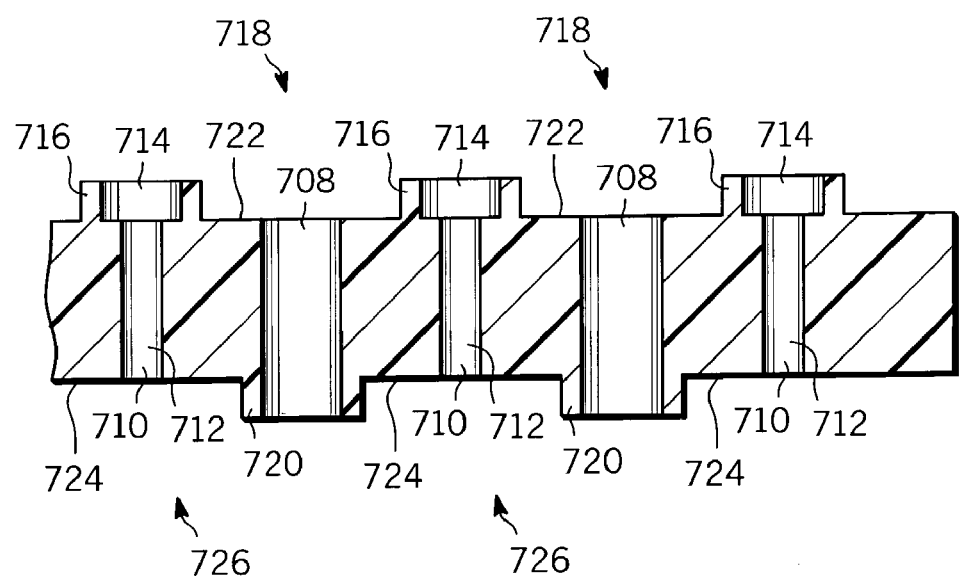
FIG. 7 is a cross-sectional view illustrating the details of the plastic layer shown in FIG. 6.

FIG. 7 is a cross-sectional view illustrating insulating layer 608 in more detail. Layer 608 includes an upper surface 722, a lower surface 724, and a plurality of openings therethrough. For example, apertures 708 are provided through which electrolyte (e.g., a copper sulfate electrolyte known as EC2001 and additives available from Shipley) may flow from a reservoir (not shown). Layer 608 also includes a plurality of apertures 710 which receive conductive pins therethrough for making electrical contact to copper layer 606. As can be seen, apertures 710 include a region 712 of reduced dimension (e.g. diameter) for receiving the stem of a conductive pin (e.g. copper) and a region 714 of an increased dimension for receiving the head of the copper pin which ultimately makes electrical contact with a wafer to be on which copper is to be deposited or removed as will be described hereinbelow. The upper surface of layer 608 has a plurality of insulating islands 716 formed thereon which insulate the conductive pins from a layer of copper which will be formed on surface 722 in recessed regions 718 between adjacent insulating islands 716 as will be described more fully below. Similarly, a plurality of insulating wells 720 are provided around apertures 710 creating recessed regions 726.

Figure 8:
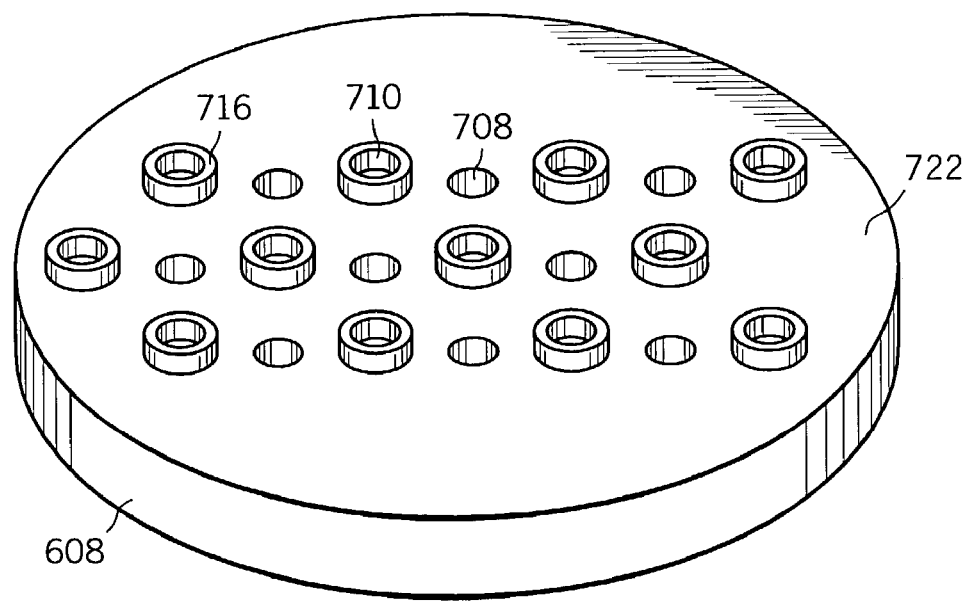
FIG. 8 is an isometric view of the upper surface of the plastic insulator shown in FIG. 7.

Insulating islands 716 are shown more clearly in FIG. 8 which is a perspective view of the upper portion of layer 608. As can be seen, layer 608 is provided with a plurality of insulating wells 716 protruding above surface 722. Apertures 708 are also visible in FIG. 8 and, as explained earlier, are provided to enable delivery of an electrolyte solution from a reservoir to a wafer. Eventually, copper layer 610 will be disposed on surface 722 and surround insulating wells 716. The upper surface of copper layer 610 will be coplanar with the upper surface of insulating wells 716. In a similar fashion, copper layer 606 will be deposited in regions 726 on lower surface 724 between insulating wells 720.

Figure 9:
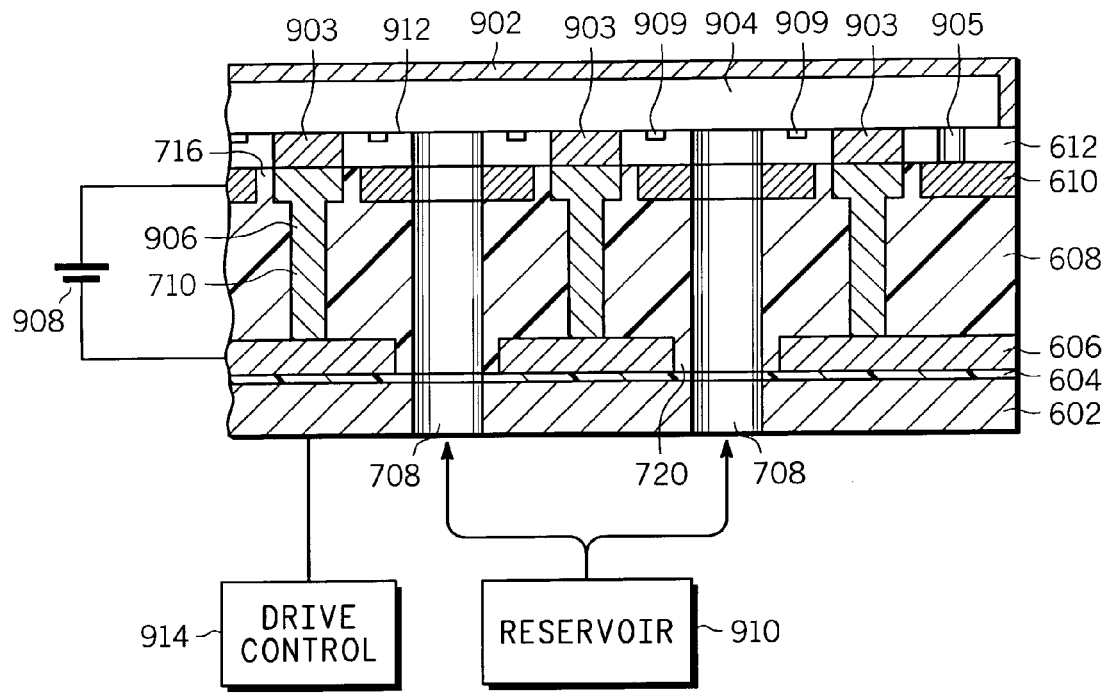
FIG. 9 is a cross-sectional view of a portion of an electrochemical deposition apparatus in accordance with an exemplary embodiment of the present invention.

In accordance with one embodiment of the invention, apparatus 900 shown in FIG. 9 is configured to perform electrochemical deposition or an electrochemical removal utilizing the platen stack shown in FIG. 6. Apparatus 900 includes stack 600 shown in FIG. 6, a wafer carrier assembly 902, a wafer 904, a source of potential 908, a source of temperature controlled electrolytic solution 910, and drive controller 914. In general, apparatus 900 is configured to electrochemically deposit onto or remove material from surface 912 of semiconductor wafer 904 retained by carrier assembly 902.

Copper layer 610 is disposed on the upper surface of insulating layer 608. The upper surface of copper layer 610 resides between insulating wells 716 and is coplanar with the upper surface thereof so as to present a planar surface to surface 912 of wafer 904. In the case of a deposition process, copper layer 610 is coupled to the anode of a source of supply voltage 908, and the second copper layer 606 disposed between insulating wells 720 is coupled to the cathode of supply voltage 908. By reversing the polarity, the process becomes an electroremoval process. Finally, insulating layer 604 is provided beneath copper layer 606. It is to be noted that support member 602, insulating layer 604, copper layer 610, and wafer support plate 612 likewise have openings therethrough which align with openings 708 to enable delivery of the electrolyte solution from reservoir 910 to the interface between the upper surface of support plate 612 and surface 912 of wafer 904. It should be also noted that support plate 612 is provided with a plurality of conductive regions 903 (e.g., made from a conductive polymer epoxy and of a hardness substantially equal of that of polishing pad 612) which provide electrical conductivity between copper pins 906 in apertures 710 and wafer 904. Support plate 612 is also provided with a plurality of channels or grooves 909 (to be discussed more fully in connection with FIG. 10) which are configured to effect transportation of the electrolyte solution on the surface of support plate 612 and into holes 905 for providing electrical coupling between conductive layer 610 and surface 912 of wafer 904. Holes or apertures 905 preferably have a cumulative cross-sectional area substantially equal to fifty percent of the surface area of surface 912. Furthermore, holes 905 may be of different sizes or diameters as is shown at 911 and 913 in FIG. 10 to provide a measure of distribution control.

Figure 10:
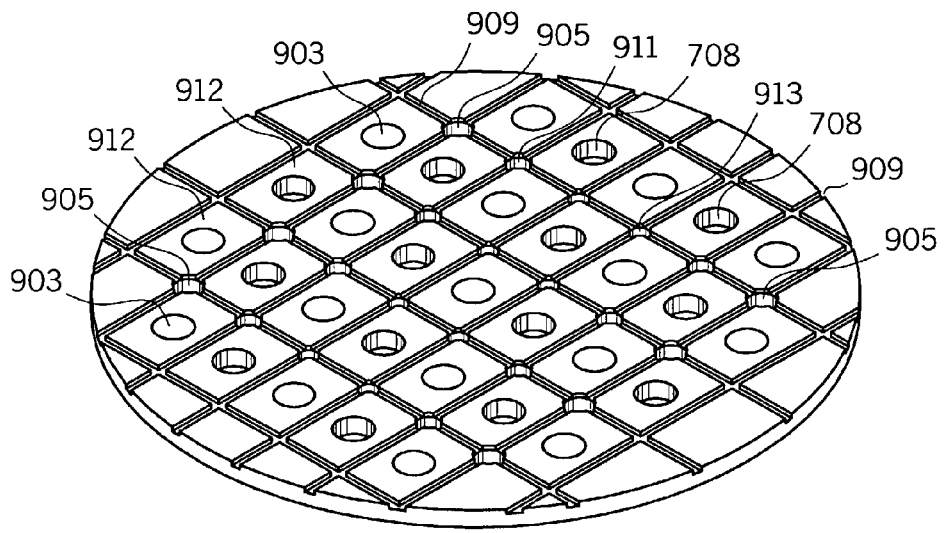
FIG. 10 is an isometric view illustrating the upper surface of the wafer support plate employed in the apparatus shown in FIG. 9.

Channels 909, slurry apertures 708, and conductive pads 903 are shown more clearly in FIG. 10 which is a perspective view illustrating the top surface of support plate 612. As can be seen, channels 909 form a rectangular grid forming islands 912 which alternately contain conductive pads 903 and openings 708.

As stated previously, electrochemical deposition results when the required potential difference is applied between surface 912 of wafer 904 and copper layer 610. The cathode of voltage source 908 is electrically coupled to copper layer 606. Copper layer 606 is electrically coupled through copper pins 906 to conductive pads 903 in support plate 612. The anode of power supply 908 is coupled to copper layer 610. Thus, a potential difference has been provided between surface 912 of wafer 904 and layer 610. Since the electrolyte solution is being provided by reservoir 910 through channels 708 to the region between support plate 612 and surface 912 of wafer 904, copper is electrochemically deposited on surface 912. Of course, it should be understood that a thin seed layer of copper must first be deposited on wafer 612. This may be accomplished by forming a seed layer of copper on the surface of wafer 904 as, for example, by sputtering, chemical vapor deposition, or any other suitable deposition methods.

Power supply 908 applies a relative positive charge to conductive layer 610 and a relative negative charge to copper layer 606. This relative negative charge is transmitted to the surface of wafer 904 by means of copper pins 906 and conductive pads 903 in support plate 612. Positioning the heads of pins 906 adjacent pads 903 provides a significant amount of electrical contact area between pads 903 and surface 912 of the wafer 904. This facilitates the creation of a uniform electric potential gradient across the surface of the wafer reducing the likelihood that edge effects and the like may result. Since the cathode electrodes are not attached directly to the surface 912 of wafer 904, a greater amount of surface area of wafer 904 is available for device formation.

The apparatus of the present invention may include a temperature control mechanism for controlling the temperature of the electrolytic solution since the temperature of the surface of wafer 904 may have a significant effect on the uniformity of the deposited conductive film, the quality of the deposited film, and the rate of deposition or removal of the film. If, for example, the temperature is too high in a given area, the deposition rate may increase in that area causing nonuniform film deposition on the surface of the wafer. To counteract the generation of localized hot spots, the electrolytic solution in reservoir in 910 may be cooled using any one of a number of known techniques for this purpose. For example, the electro-solution may be subject to a cooler or chiller before being delivered to surface 912 of wafer 904.

The platen assembly having support plate 612 disposed thereon is generally configured to move relative to carrier 902 and wafer 904 so as to promote a uniform deposition of material onto surface 912. The platen assembly may be connected to a drive motor assembly 914 that is operative to rotate the platen about a vertical axis. It will be appreciated, however, that the drive or motor assembly may be operative to move the platen assembly and polishing surface in an orbital, linear, rotational, or oscillatory pattern or any combination thereof. For example, U.S. Pat. No. 5,582,534 (Sheldon et al) and U.S. Pat. No. 5,938,884 (Hoshizaki et al) disclose several mechanisms for creating an orbital motion.

Figure 11:
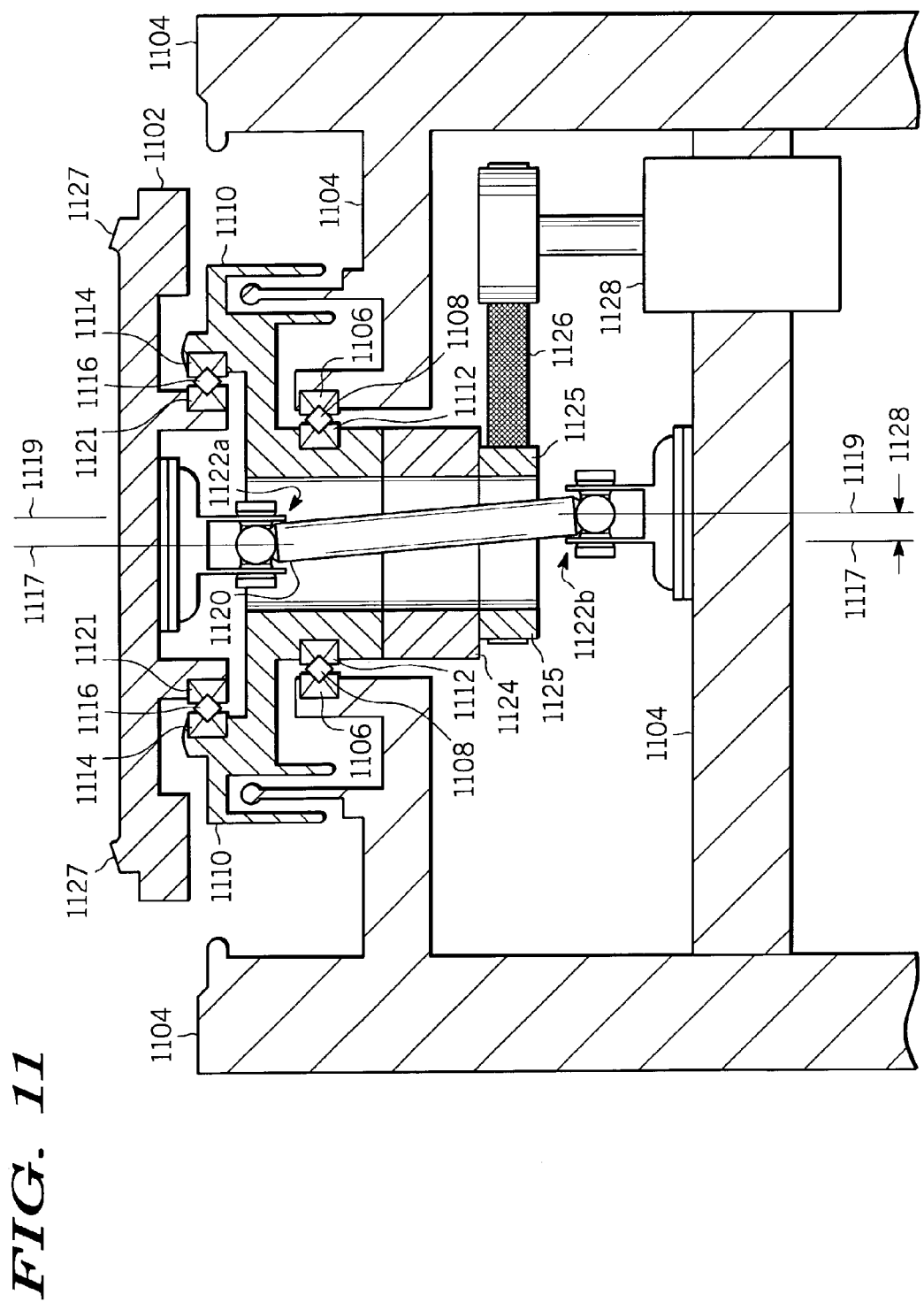
FIG. 11 is a cross-sectional view of an apparatus for producing orbital motion.

FIG. 11 is a cross-sectional view of an exemplary apparatus that may be used to generate an orbital motion for a platen 1102 of the type described above. The supporting base is generally disclosed in U.S. Pat. No. 5,554,064 Breivogel et al. and is hereby incorporated by reference. The supporting base may have a rigid frame 1104 that can be fixedly secured. Stationary frame 1104 is used to provide support and balance. Outside ring 1106 of a lower bearing 1105 is rigidly fixed by clamps to stationary frame 1104. Stationary frame 1104 prevents outside ring 1106 of lower bearing 1108 from rotating. Wave generator 1110 formed of a circular, hollow rigid stainless steel body is clamped to the inside ring 1112 of lower bearing 1108. Wave generator 1110 is also clamped to outside ring 1114 of an upper bearing 1116. Wave generator 1110 positions upper bearing 1116 parallel to lower bearing 1108. Wave generator 1110 offsets the center axis 1117 of upper bearing 1116 from the center axis 1119 of lower bearing 1108. A circular platen 1102 is symmetrically positioned and securely fastened to the inner rings of 1121 of upper bearing 1116. A wafer support plate or plate assembly can be securely fastened to ridge 1127 formed around the outside edge of the upper surface of platen 1102.

A universal joint 1120, having two pivot points 1122a and 1122b, is securely fastened to stationary frame 1104 and to the bottom surface of platen 1102. The lower portion of wave generator 1110 is rigidly connected to a hollow and cylindrical drive spool 1124 that in turn is connected to a hollow and cylindrical drive pulley 1125. Drive pulley 1125 is coupled by a belt 1126 to a motor 1128. Motor 1128 may be a variable speed, three phase, and two horsepower AC motor.

The orbital motion of platen 1102 is generated by spinning wave generator 1110. Wave generator 1110 is rotated by variable speed motor 1128. As wave generator 1110 rotates, the center axis 1117 of upper bearing 1116 orbits about the center axis 1119 of lower bearing 1108. The radius of the orbit of the upper bearing 1119 is equal to the offset (R) 1128 between the center axis 1117 of upper bearing 1116 and the center axis 1119 of the lower bearing 1108. Upper bearing 1116 orbits about the center axis 1119 of lower bearing 1108 at a rate equal to the rotation of wave generator 1110. It is to be noted that the outer ring 1114 of upper bearing 1116 not only orbits but also rotates (spins) as wave generator 1110 rotates. The function of universal joint 1120 is to prevent torque from rotating or spinning platen 1102. The dual pivot points 1122a and 1122b of universal joint 1120 allow the platen 1102 to move in all directions except a rotational direction. By connecting platen 1102 to the inner ring 1121 of upper bearing 1116 and by connecting universal joint 1120 to platen 1102 and stationary frame 1104 the rotational movement of inner ring 1121 and platen 1102 is prevented and platen 1102 only orbits as desired. The orbit rate of platen 1102 is equal to the rotation rate of wave generator 1110 and the orbit radius of platen 1102 is equal to the offset of the center 1117 of upper bearing 1116 from the center 1117 of lower bearing 1108. It is to be appreciated that a variety of other well-known means may be employed to facilitate the orbital motion of the wafer support plate. While a particular method for producing an orbital motion has been given in detail, the present invention may be practiced using a variety of techniques for orbiting the support pad on the platen 1102.

The electrolytic solution contained in reservoir 910 includes the suitable precursors to the material being deposited onto the surface of wafer 904 (in this case, copper). Such solutions are generally known in the art and typically include dissolved copper such as copper sulfate, leveling agents, suppressants, and accelerators.

Thus, there has been provided an improved method and apparatus for electrochemically depositing and/or removing a conductive material on a workpiece surface. A potential difference is applied across a platen and a surface of a wafer through the use of upper and lower copper layers and conductive pins through the platen to complete the circuit. This potential difference in the presence of an electrolytic material such as a copper sulfate causes copper to be deposited on or removed from the surface of a semiconductor wafer depending on the polarity of the potential difference. A reservoir is provided for supplying a non-abrasive electrolyte into the region between a wafer support plate and the wafer surface. Since the platen and support plate are only slightly larger in diameter than the wafer, electrolyte and/or slurry is introduced only under the wafer thus avoiding unwanted distribution of the slurry. Furthermore, an improved wafer support plate is provided which is made of a material that is smooth and has a low coefficient of friction so as to avoid scratching the wafer surface. The wafer support surface is provided with electrolyte distribution channels. The result is a more reliable and easier to manufacturer apparatus and method of depositing and/or removing material from a semiconductor wafer.

In the foregoing specification, the invention has been described with reference to specific embodiments. However, it may be appreciated that various modifications and changes can be made without departing from the scope of the invention as set forth in the appended claims. Accordingly, the specification and figures are to be regarded as illustrative rather than as restrictive, and all such modifications are intended to be included within the scope of the present invention.

What is claimed is:

1. An apparatus for performing an electrochemical process on a surface of a workpiece, comprising:
    a first conductive element for coupling to a first potential;
    an insulating member disposed overlying said first conductive element;
    a second conductive element for coupling to a second potential, wherein said second conductive element overlies said insulating member;
    a substantially smooth, substantially incompressible support plate overlying said second conductive element and having a plurality of conductive regions that are electrically coupled to said first conductive element, a plurality of holes that expose said second conductive element, and a plurality of channels that are in fluid communication with said plurality of holes, wherein said support plate has a coefficient of surface friction of less than about 0.2 and a surface roughness less than about 100 micro-inches per inch; and
    a carrier configured to position the workpiece proximate said support plate.

2. An apparatus according to claim 1 wherein said support plate is made of a polymeric material.

3. An apparatus according to claim 2 wherein said polymeric material is polytetrafluoroethylene.

4. An apparatus according to claim 2 wherein said polymeric material is selected from the group consisting of polyether ether keytone, acetal homopolymer, polyethylene terapthalate, polyphenyl sulfide, polyvinyl chloride, and polytetrafluoroethylene.

5. An apparatus according to claim 2, wherein said polymeric material has a bulk modulus greater than approximately 50,000 psi under an applied surface pressure of less than approximately four psi.

6. An apparatus according to claim 5 wherein said polymeric material has a bulk modulus greater than approximately 70,000 psi under an applied surface pressure of less than approximately two psi.

7. An apparatus according to claim 1 further comprising a drive mechanism for imparting orbital motion to said support plate.

8. An apparatus according to claim 7 wherein said process is an electrodeposition process.

9. An apparatus according to claim 7 wherein said process is an electroremoval process.

10. An apparatus according to claim 1 wherein said insulating member comprises a plurality of first apertures configured to receive an electrolyte and said support plate comprises a plurality of second apertures, wherein each one of said plurality of second apertures is in fluid communication with one of said plurality of first apertures.

11. An apparatus according to claim 10 wherein said channels form a rectangular grid bounding islands that alternately contain said conductive regions and said second apertures.

12. An apparatus according to claim 1, wherein the cumulative cross-sectional area of said plurality of holes is substantially half the area of said surface of said workpiece.

13. An apparatus for performing an electrochemical process on a surface of a workpiece, comprising:
    a first conductive element for coupling to a first potential;
    an insulating member disposed overlying said first conductive element, wherein said insulating member comprises a plurality of first apertures configured to receive an electrolyte;
    a second conductive element for coupling to a second potential, wherein said second conductive element overlies said insulating member; and
    a polytetrafluoroethylene support plate overlying said second conductive element and having a plurality of conductive regions that are electrically coupled to said first conductive element a plurality of holes that expose said second conductive member, a plurality of second apertures, wherein each one of said plurality of second apertures is in fluid communication with one of said plurality of first apertures, and a plurality of channels that are in fluid communication with said plurality of holes.

14. An apparatus according to claim 13 wherein said channels form a rectangular grid bounding islands that alternately contain said conductive regions and said second apertures.

15. An apparatus for performing an electrochemical process on a surface of a workpiece, comprising:
a polymeric wafer support having a substantially smooth surface and having a plurality of conductive regions, a plurality of holes a plurality of first apertures configured to receive an electrolyte, and a plurality of channels that are in fluid communication with said plurality of holes wherein said support has a coefficient of surface friction of less than about 0.2 and a surface roughness less than about 100 micro-inches per inch;
a first conductive element for coupling to a first potential and underlying said polymeric wafer support such that said first conductive element is exposed by said plurality of holes;
an insulating member disposed underlying said first conductive element, wherein said insulating member comprises a plurality of second apertures that are coaxial with said plurality of first apertures;
a second conductive element for coupling to a second potential, wherein said second conductive element underlies said insulating member; and
a plurality of conductive elements that electrically couple said second conductive element and said plurality of conductive regions.

16. An apparatus according to claim 15 wherein said polymeric wafer support has a coefficient of surface friction of between approximately 0.06 and 0.1.

17. An apparatus according to claim 16 wherein the surface roughness is between approximately 10 and 50 micro-inches per inch.

18. An apparatus according to claim 15 wherein said polymeric wafer support is formed of a material that is selected from the group consisting of polyether ether keytone, acetal homopolymer, polyethylene terapthalate, polyphenyl sulfide, polyvinyl chloride, and polytetrafluoroethylene.

19. An apparatus for performing an electrochemical process on a surface of a workpiece, comprising;
a first conductive element for coupling to a first potential;
a second conductive element for coupling to a second potential;
an insulating member disposed between said first conductive element and said second conductive element wherein said insulating member comprises a plurality of first apertures configured to receive an electrolyte;
a substantially incompressible support plate having a surface roughness less than about 100 micro-inches per inch and a substantially low coefficient of surface friction and overlying said second conductive element, wherein said support plate has a plurality of conductive regions that are electrically coupled to said first conductive clement a plurality of holes tat expose said second conductive element, a plurality of second apertures, wherein each one of said plurality of said second apertures is coupled to one of said plurality of first apertures, and a plurality of channels that are in fluid communication with said plurality of holes, wherein said plutaiity of channels forms a rectangular grid bounding islands, each one of which contains one of said plurality of conductive regions or one of said plurality of second apertures; and
a carrier configured to position the workpiece proximate said support plate.

20. An apparatus according to claim 19 wherein the coefficient of surface friction is below approximately 0.2.

21. An apparatus according to claim 20 wherein the coefficient of surface friction is between approximately 0.06 and 0.10.

22. An apparatus according to claim 21 herein said support plate is formed of a polymeric material selected from the group consisting of polyether ether keytone, acetal homopolymer, polyethylene terapthalate, polyphenyl sulfide, polyvinyl chloride, and polytetrafluoroethylene.

* * * * *

UNITED STATES PATENT AND TRADEMARK OFFICE
CERTIFICATE OF CORRECTION

| | | |
|---|---|---|
| PATENT NO. | : 7,025,860 B2 | Page 1 of 1 |
| APPLICATION NO. | : 10/421489 | |
| DATED | : April 11, 2006 | |
| INVENTOR(S) | : Saket Chadda | |

It is certified that error appears in the above-identified patent and that said Letters Patent is hereby corrected as shown below:

On the title page (57), line 8, delete "," after "to".

In column 12, line 64, delete "element" and insert therefor --element,--

In column 14, line 7, delete "element" (second occurrence) and insert therefor --element,--.

In column 14, line 16, delete "clement" and insert therefor --element,--.

In column 14, line 16, delete "tat" and insert therefor --that--.

In column 14, line 22, delete "plutaiity" and insert therefor --plurality--.

Signed and Sealed this

Twenty-second Day of May, 2007

JON W. DUDAS
*Director of the United States Patent and Trademark Office*